United States Patent
Hatada et al.

(10) Patent No.: US 7,876,518 B2
(45) Date of Patent: Jan. 25, 2011

(54) CERTIFY TESTING APPARATUS AND CERTIFY TESTING METHOD

(75) Inventors: Shuji Hatada, Ichihara (JP); Junichi Fujita, Chiba (JP)

(73) Assignee: Showa Denko K.K., Tokyo (JP)

( * ) Notice: Subject to any disclaimer, the term of this patent is extended or adjusted under 35 U.S.C. 154(b) by 407 days.

(21) Appl. No.: 12/031,044

(22) Filed: Feb. 14, 2008

(65) Prior Publication Data

US 2008/0198494 A1    Aug. 21, 2008

(30) Foreign Application Priority Data

Feb. 16, 2007   (JP) .................... 2007-036293

(51) Int. Cl.
*G11B 5/09* (2006.01)
(52) U.S. Cl. ............................................. 360/53
(58) Field of Classification Search ............. 360/53, 360/40, 31, 48, 60, 77.17
See application file for complete search history.

(56) References Cited

U.S. PATENT DOCUMENTS

| | | | | | |
|---|---|---|---|---|---|
| 3,491,288 | A | * | 1/1970 | Forster | ............. 324/213 |
| 4,231,071 | A | * | 10/1980 | Anderson | ............. 360/40 |
| 4,550,351 | A | * | 10/1985 | Hamalainen | ............. 360/77.17 |
| 5,533,031 | A | * | 7/1996 | Dounn et al. | ............. 714/718 |
| 5,978,162 | A | * | 11/1999 | Behrens et al. | ............. 360/53 |
| 6,130,793 | A | | 10/2000 | Ohmori et al. | |
| 6,574,754 | B1 | * | 6/2003 | Smith | ............. 714/47 |

FOREIGN PATENT DOCUMENTS

| | | |
|---|---|---|
| JP | 10-105908 | 4/1998 |
| JP | 2003-257016 | 9/2003 |

* cited by examiner

*Primary Examiner*—Fred Tzeng
(74) *Attorney, Agent, or Firm*—Sughrue Mion, PLLC

(57) ABSTRACT

An apparatus is provided that can detect error locations in certify testing of a magnetic recording medium without influence from undulation of the substrate or irregularities in film thickness distribution of magnetic film of the magnetic recording medium. Such an apparatus tests playback signals of a magnetic recording medium, the magnetic head 53 conducts playback of signals which are recorded in the magnetic recording medium. The AGC unit 34 amplifies the played back signals at a gain rate controlled according to elapsed time after input of a signal originating in an error area of the magnetic recording medium among the played back signals. The CMP unit 38 compares the slice level and the level of the amplified signals, and discriminates the existence or non-existence of error.

7 Claims, 8 Drawing Sheets

CERTIFY TESTING APPARATUS AND CERTIFY TESTING METHOD

BACKGROUND OF THE INVENTION

1. Field of the Invention

The present invention relates to a certify testing apparatus and certify testing method, and particularly to a certify testing apparatus and certify testing method for magnetic recording media used in so-called hard disk drives.

Priority is claimed on Japanese Patent Application No. 2007-36293, filed Feb. 16, 2007, the content of which is incorporated herein by reference.

2. Description of the Related Art

Magnetic recording devices typified by hard disk drives are widely used as external memory units of information processing devices such as computers, and in recent years have also come to be used as video recording devices for animated images.

Hard disk drives ordinarily include: a shaft wherein a discoid (donut-shaped) magnetic recording medium with an opening at the center is rotated alone or concentrically in a superimposed plurality (synchronous rotation is conducted in the case of a plurality); a motor which is joined via bearings to the pertinent shaft and which causes rotation of the magnetic recording medium; magnetic heads used for recording and/or playback on both faces of the magnetic recording medium; support arms to which the pertinent heads are attached; and a head stack mechanism which is capable of synchronously moving multiple support arms (this is called a "head stack assembly"), and which causes the magnetic heads to move to desired positions on the magnetic recording medium. The magnetic recording playback heads are ordinarily floating-type heads, and move at a fixed floating height on the magnetic recording medium.

Magnetic recording media loaded into hard disk drives are manufactured by the following process.

After conducting texturing treatment and the like on the surface of a substrate generally composed of aluminum alloy, glass or the like, the magnetic recording medium is prepared by sequentially forming a base layer, magnetic layer, protective layer, lubricating layer, etc. on top of this. Subsequently, a glide testing process and certify testing process are conducted as testing processes of the obtained magnetic recording medium.

The glide testing process is a process which tests whether or not protrusions exist on the surface of a magnetic recording medium. That is, when a magnetic recording medium undergoes recording playback with use of magnetic heads, if there exist protrusions on the surface of the medium with a height equal to or greater than the interval between the medium and the magnetic head, these will cause damage to the magnetic head as it strikes the protrusions, and defects in the medium. In this process, the existence or non-existence of protrusions of such height is tested (e.g., see Patent Document 1, i.e. Japanese Unexamined Patent Application, First Publication No. H10-105908). This process conducts testing for protrusions on the surface of the magnetic recording medium, but recording and playback of signals of the magnetic recording medium are not conducted.

Certify testing is conducted on magnetic recording media which pass the glide testing process. As with the recording and playback of an ordinary hard disk drive, the certify testing process records prescribed signals on a magnetic recording medium with a magnetic head, after which the signals are played back. The quality of the medium—e.g., electrical properties and existence or absence of defects—is then ascertained from the obtained playback signals (e.g., see Patent Document 2, i.e. Japanese Unexamined Patent Application, First Publication No. 2003-257016).

As the certify testing process of magnetic recording media is a testing process that serves to confirm the capability of recording and playback of prescribed signals by a magnetic head as in the recording and playback of a hard disk drive, it tests whether prescribed signals can be correctly read out after they have been written into the magnetic recording medium, in a manner similar to the actual method of use in a hard disk drive.

When the signal processing system of a certify testing apparatus is outlined, a configuration like that of FIG. 7 is obtained.

That is, with respect to a magnetic recording medium in which prescribed magnetic information has been written, a magnetic head 71 sends playback signals that have been read from the magnetic recording medium to downstream circuits, and it is discriminated in these downstream circuits whether or not individual playback bits are errors by having the CMP 78 compare the playback signals and the slice level which is set based on a TAA (Track Average Amplitude=average output of 1 cycle) unit 76.

For example, with the magnetic recording medium of FIG. 8A, when certify testing is conducted on a track having an error area at the location shown by the arrow mark, the playback signals at that time are as shown in FIG. 8B. These playback signals are called envelope signals, and are band-like signals with a constriction at the center. In certify testing, sine wave signals are written into and read from the magnetic recording medium at high frequencies on the order of 50-100 MHz. That is, in the case where testing is conducted in a state where the disk is at a rotational frequency of 6000 rpm, approximately 500,000 or more sinusoidal waveforms are outputted per disk cycle. In the case where the signals pertaining to 1 cycle of a disk in this state are viewed by measuring instrument, band-like signals like that of FIG. 8B are observed.

When a slice level which detects error areas is appropriately set with respect to these playback signals, the location of error area E1 of FIG. 8A can be detected as an error location.

However, in an actual magnetic recording medium, it is often the case that undulations or the like occur over the entire substrate surface and that the substrate surface is not a perfect plane; such undulations or the like render the certify testing of magnetic recording media difficult. For example, considering the case where, as in the magnetic recording medium of FIG. 9A, an undulation occurs which is high in a high output region A1 toward the upper right of the substrate and low in a low output region A2 toward the lower left, and where an error area E2 exists at an upper right position of the substrate, when certify testing is conducted with respect to such a track, the playback signals at that time will be envelope signals like that of FIG. 9B. With respect to the playback signals in this case, even if the slice level which detects error areas is set like that of FIG. 9B in the same way as FIG. 8, it is not possible to detect the location of the allow mark of FIG. 9A as an error location.

The foregoing was presented as a case where undulation occurs in the substrate of a magnetic recording medium as a factor inhibiting detection of an error location in certify testing of a magnetic recording medium, but apart from undulation of the substrate, there are also irregularities in film thickness distribution of the magnetic film of magnetic recording media, and so on.

The present invention was made in light of such circumstances, and its object is to offer a certify testing apparatus and certify testing method which are capable of detecting error locations without being affected by undulation in the substrate of the magnetic recording medium, irregularities in film thickness distribution of magnetic film and the like in certify testing of magnetic recording media.

SUMMARY OF THE INVENTION

As a result of diligent study aimed at solving the aforementioned problems, the present inventors discovered that the aforementioned problems can be solved by dynamically varying the gain of playback signals by amp according to the time after detection of a signal originating in an error area on the magnetic recording medium surface among the playback signals from the magnetic head in the certify testing process of a magnetic recording medium, and thereby perfected the present invention. That is, the invention of the present application pertains to the follows.

(1) A certify testing apparatus which tests playback signals of a magnetic recording medium, including: a magnetic head part which plays back signals that are recorded in said magnetic recording medium; an amplification means which amplifies said played back signals at a gain rate controlled according to elapsed time after input of a signal originating in an error area of said magnetic recording medium among said played back signals; and a comparison/discrimination means which compares the slice level and level of said amplified signals, and which discriminates the existence or non-existence of errors.

(2) The certify testing apparatus according to the foregoing paragraph 1, wherein—after input of said signal originating in an error area—said amplifying means conducts amplification at a gain rate controlled so that the output level is fixed only when a time period between $25\mu$ and $1000\mu$ seconds has elapsed.

(3) The certify testing apparatus according to either of the foregoing paragraphs 1 or 2, wherein said amplification means is an automatic gain rate control circuit which conducts recursive control of the gain rate at the aforementioned time constant so that the output level is fixed, and which amplifies said played back signals.

(4) The certify testing apparatus according to any of the foregoing paragraphs 1 to 3, including a slice level setting means which calculates an average value of said amplified signals, and which provides said comparison/discrimination means with a value as said slice level obtained by multiplying the pertinent average value by a predetermined rate.

(5) A certify testing method of a certify testing apparatus which tests playback signals of a magnetic recording medium, which is a certify testing method including the steps of: a first process which plays back signals that are recorded in said magnetic recording medium; a second process which amplifies said played back signals at a gain rate controlled according to elapsed time after input of a signal originating in an error area of said magnetic recording medium among said played back signals; and a third process which compares the slice level and level of said amplified signals, and which discriminates the existence or non-existence of errors.

Figure 5A:
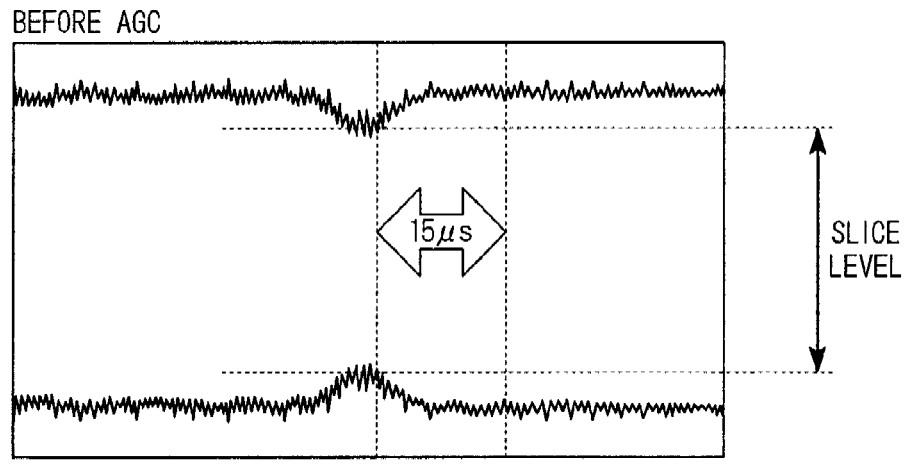
Figure 5B:
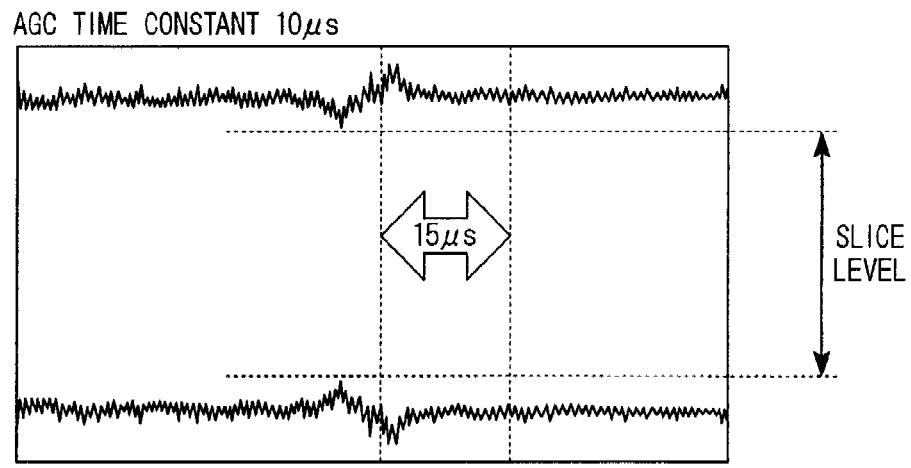
Figure 5C:
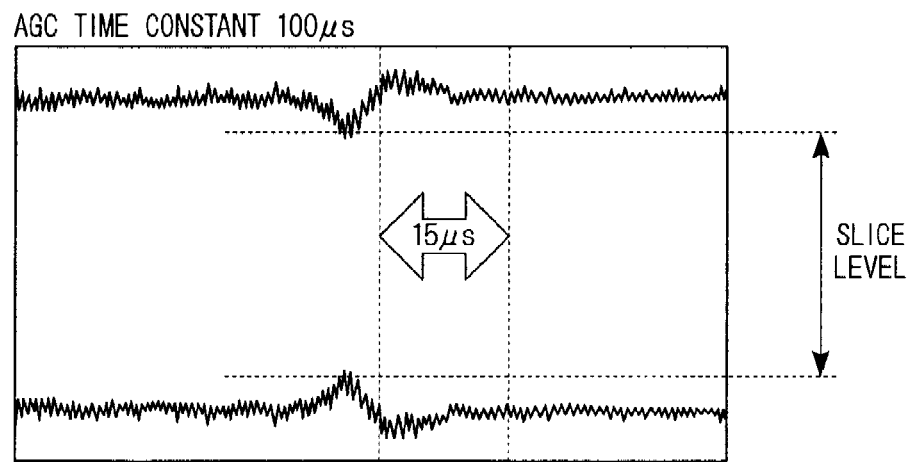

Each of FIGS. 5A, 5B and 5C consists of graph which shows a playback signal of a location where the error length is equivalent to $15\mu$ seconds in this same embodiment.

Figure 6:
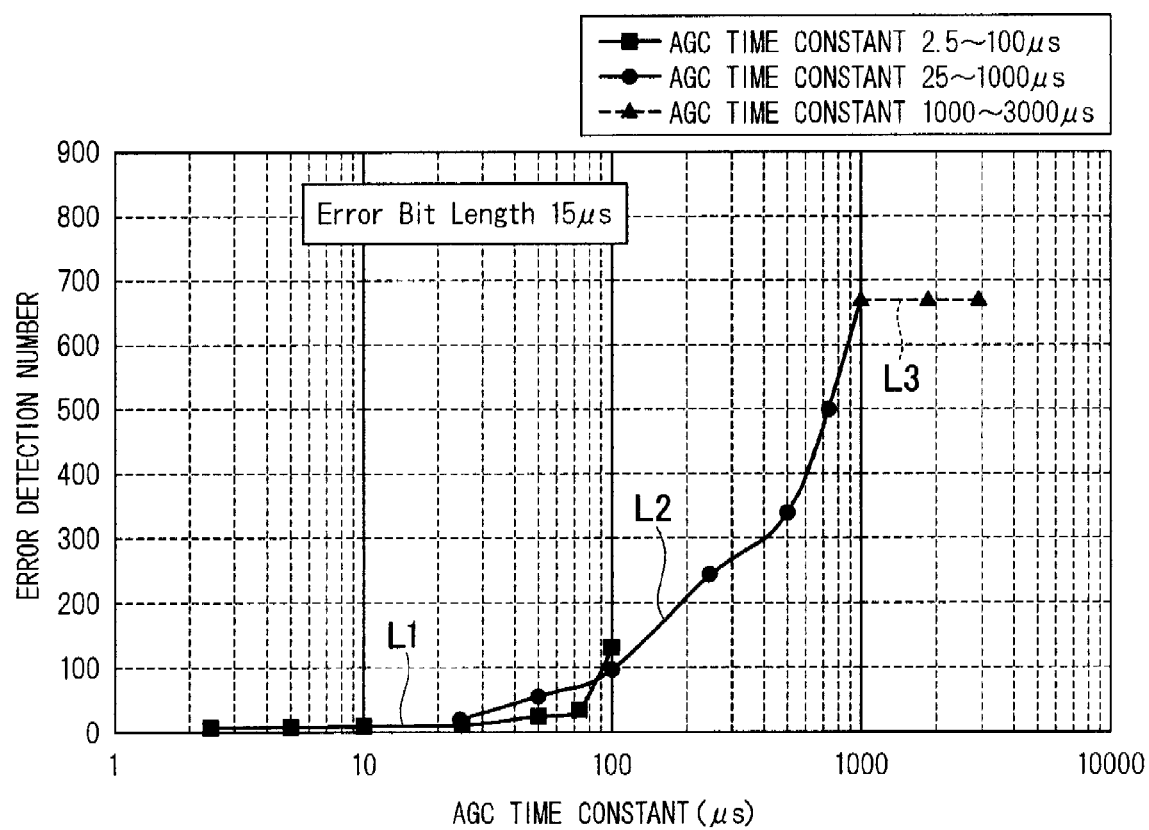

FIG. 6 is a graph which shows the relation of time constants and error detection numbers in this same embodiment.

Figure 7:
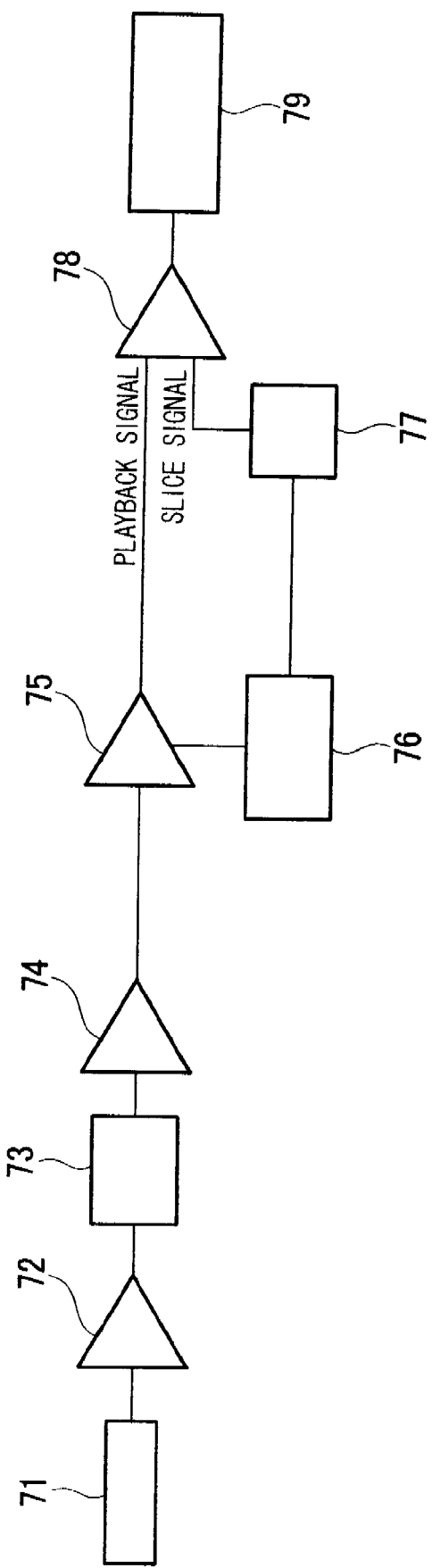

FIG. 7 is a schematic block diagram which shows the configuration of a conventional certify testing apparatus.

Figure 8A:
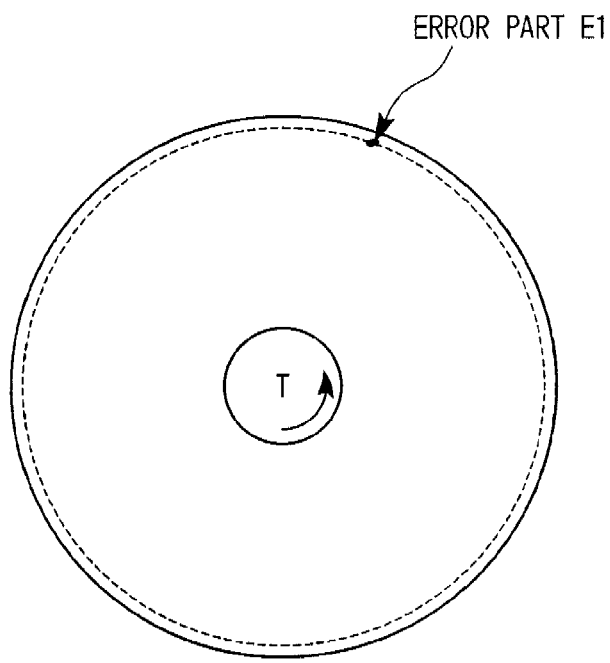

FIG. 8A is a drawing which illustrates an undulation-free magnetic recording medium.

Figure 8B:
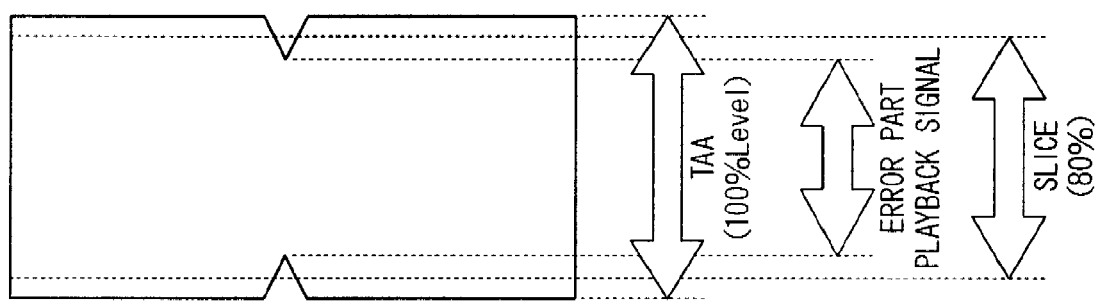

FIG. 8B is a drawing which illustrates playback signals from a conventional certify testing apparatus.

Figure 9A:
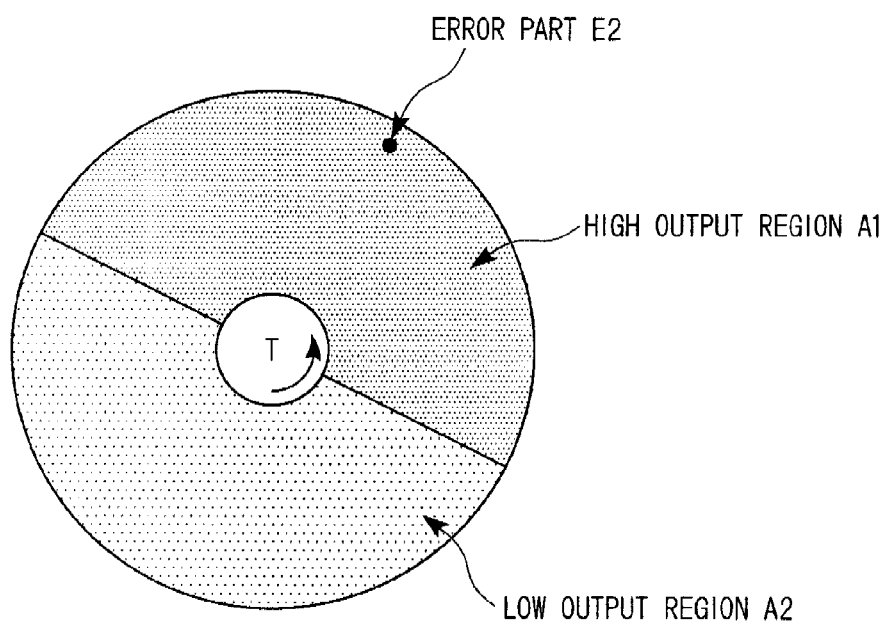

FIG. 9A is a drawing which illustrates an undulating magnetic recording medium.

Figure 9B:
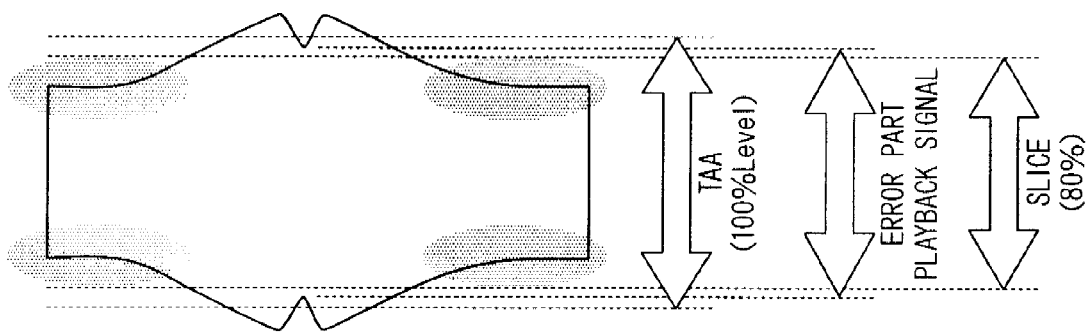

FIG. 9B is a drawing which illustrates playback signals from a conventional certify testing apparatus.

DETAILED DESCRIPTION OF THE INVENTION

The details of the present invention are described below.

Figure 1:
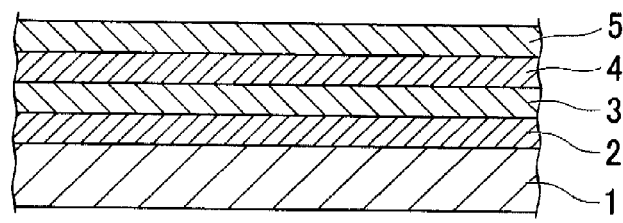
FIG. 1 is a sectional view which illustrates the structure of a magnetic recording medium pertaining to one embodiment of the present invention.

FIG. 1 illustrates the structure of a magnetic recording medium pertaining to the present embodiment. The magnetic recording medium shown here is a medium where sequential lamination is conducted of a non-magnetic base layer 2, magnetic layer 3, protective layer 4 and liquid lubricating layer 5 on a non-magnetic substrate 1.

As the non-magnetic substrate 1 pertaining to the magnetic recording medium of the present embodiment, one may use a substrate where a film composed of NiP or NiP alloy is formed on a base composed of metal material such as Al or Al alloy. In addition, as the non-magnetic substrate 1, it is also acceptable to use a substrate composed of non-metallic material such as glass, ceramics, silicon, silicon carbide, carbon, resin or the like, where a film of NiP or NiP alloy is formed on a base composed of this non-metallic material.

As the non-metallic material, it is preferable from the standpoint of surface smoothness to select from one or the other of glass or silicon. Use of glass is particularly preferable from the standpoints of cost and durability. As glass, one may use crystallized glass or amorphous glass. As amorphous glass, general-purpose soda lime glass, alumino-borosilicated glass, and aluminosilicated glass may be used. As crystallized glass, lithium crystallized glass may be used.

As a ceramic substrate, one may cite a sintered body or fiber-reinforced version thereof whose main component is general-purpose aluminum oxide, silicon nitride, etc. As lower flying heights of magnetic heads are being demanded for purposes of enhancing recording density, it is desirable to enhance the smoothness of the surface of the non-magnetic substrate 1. That is, it is desirable that the non-magnetic substrate 1 have an average surface roughness Ra of 0.5 nm or less, and preferably 0.3 nm or less.

The non-magnetic base layer 2 is formed on top of the non-magnetic substrate. As the non-magnetic base layer 2, Cr alloy or the like may be used The magnetic layer 3 pertaining to the magnetic recording medium of the present invention may use an alloy of Co—Cr—Ta, Co—Cr—Pt, Co—Cr—Pt—Ta, Co—Cr—Pt—B—Ta, etc.

The protective layer 4 pertaining to the magnetic recording medium of the present embodiment may use conventional materials of public knowledge such as a simple substance of carbon or SiC, or a material having this as its main component. From the standpoint of durability or magnetic spacing reduction in cases of use under high recording density conditions, it is preferable that the film thickness of the protective layer 4 be within the range of 1 nm to 10 nm. Here, magnetic spacing expresses the distance between the magnetic layer 3 and the read/write element of the magnetic head. As magnetic spacing narrows, electromagnetic conversion properties improve.

With the magnetic recording medium of the present embodiment, it is preferable that a liquid lubricating layer 5 be provided on top of the protective layer. It is preferable that the layer thickness of the liquid lubricating layer be within a range of 1.5 nm to 2.5 nm. As the liquid lubricating agent, one may use, for example, perfluoropolyether compounds.

With the testing method (certify testing method) for magnetic recording media of the present invention, it is preferable to provide a glide testing process prior to the testing process. As stated above, the glide testing process is a process which tests whether protrusions exist on the surface of a magnetic recording medium. It is a process which tests for the existence or non-existence of protrusions on the surface of a magnetic recording medium with signals from a test head by rotating the magnetic recording medium, floating the test head, and scanning the surface of the magnetic recording medium with the test head. By providing this testing process before the certify testing method, damage to the test head pertaining to the certify testing method can be prevented.

As a test head which can be used in glide testing, one may cite heads having thermosensitive elements. That is, when the test head contacts protrusions existing on a magnetic recording medium which is rotating at high speed, heat is momentarily generated by the test head, and the thermosensitive element detects that heat and outputs a signal, thereby enabling conduct of glide testing. It is preferable that evaluation in this glide testing process be conducted with a magnetic recording medium that has a lower floating height than the floating height of the magnetic recording playback heads normally used in hard disk drives.

Figure 2:
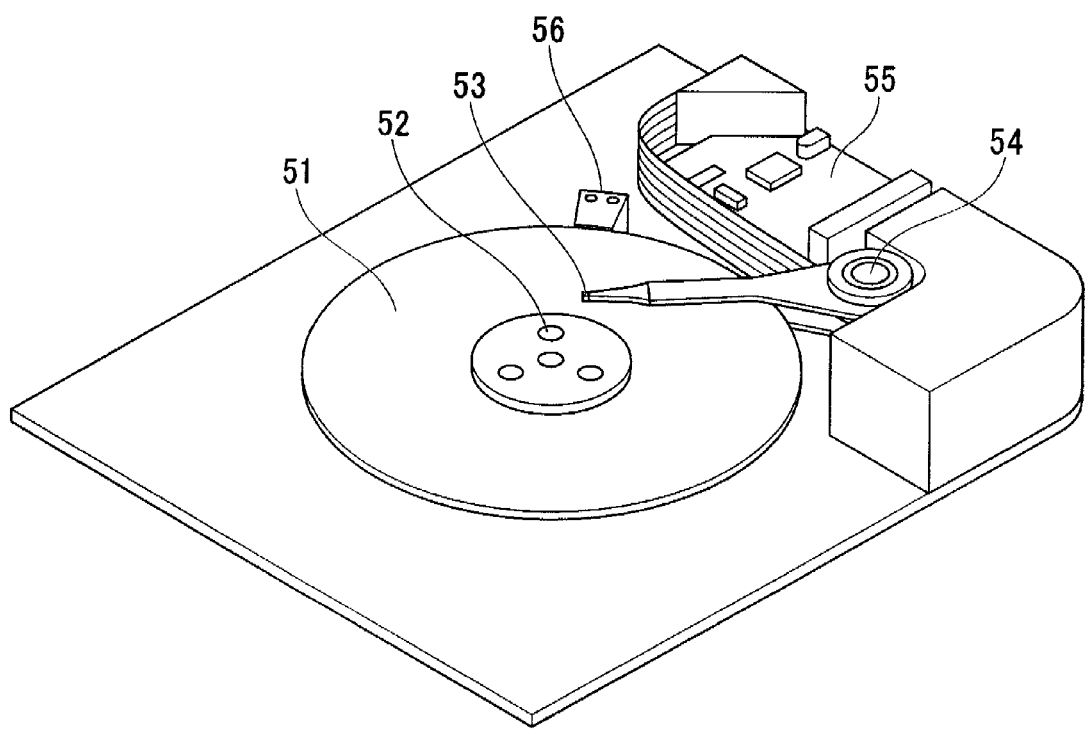
FIG. 2 is an oblique view of the certify testing apparatus of this same embodiment.

FIG. 2 is an oblique view of the certify testing apparatus of the present embodiment. The certify testing apparatus of the present embodiment is an apparatus which tests playback signals in the aforementioned magnetic recording medium, and is provided with a mechanism which sets in place a subject magnetic recording medium 51, a medium drive unit 52 which causes rotation of the magnetic recording medium 51, a magnetic head 53 which plays back recording signals from the magnetic recording medium 51, a head drive unit 54 which causes relative movement of this magnetic head 53 relative to the magnetic recording media 51, and a playback signal processing mechanism 55 which processes the playback signals from the magnetic head. It should be noted that symbol 56 is a lamp which retracts the magnetic head 53 when the magnetic recording medium 51 is replaced.

Figure 3:
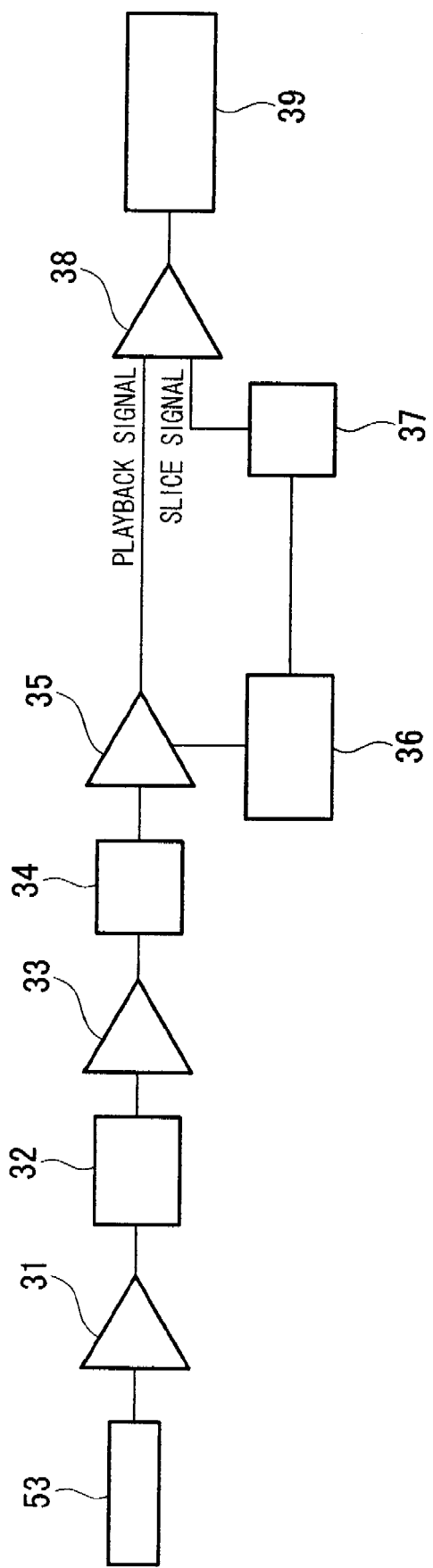
FIG. 3 is a schematic block diagram which shows the configuration of the magnetic head 53 and playback signal processing mechanism 55 of this same embodiment.

FIG. 3 is a schematic block diagram showing the configuration of the magnetic head 53 and the playback signal processing mechanism 55. An amp unit 31 amplifies playback signals from the magnetic head 53 at a fixed gain rate. An LPF (low pass filter) unit 32 suppresses high frequency components of the amplified playback signals, and outputs low frequency components. An amp unit 33 amplifies and outputs low-frequency-component signals outputted by the LPF unit 32 at a fixed gain rate. An AGC (auto gain control) unit (amplification means) 34 conducts recursive control of the gain rate at a below-mentioned time constant so that the output level is fixed, and amplifies output signals of the amp unit 33. The amp unit 35 outputs the signals amplified by the AGC unit 34 as playback signals which have been further amplified at the fixed gain rate.

A TAA (track average amplitude) unit 36 outputs a 1 track portion (1 cycle portion) of the playback signals outputted by the amp unit 35 as averaged digital signals. A DAC unit 37 outputs slice signals which convert the digital signals outputted by the TAA unit 36 to analog signals of 80% level (slice level). A CMP (comparator) unit (comparison/discrimination means) 38 compares the sizes of the playback signals outputted by the amp unit 35 and the slice signals outputted by the DAC unit 37. An LSI (large scale integrated) unit 39 is an error discrimination means which deems that an error exists when the CMP unit discriminates that the playback signal is smaller than the slice signal.

In the present embodiment, the TAA unit 36 and DAC unit 37 function as a slice level setting means.

With the certify testing apparatus shown in FIG. 2, only a configuration which plays back information recorded in a magnetic recording medium is described, but a device which writes information to be read by this apparatus into the magnetic recording medium can also be added to the certify testing apparatus of the present configuration. That is, in the case where information is written into a magnetic recording medium using the certify testing apparatus of the present configuration, the magnetic head 53 becomes a head that is also capable of writing, and the playback signal processing mechanism 55 is configured to also be capable of recording signal processing.

The method for testing playback signals from magnetic recording media of the invention of the present application (refers to the so-called certify testing method) is characterized by conducting playback of recording signals of a magnetic recording medium by magnetic head, and dynamically varying the gain (gain rate) of the playback signals by amp according to the time from detection of signals originating in error areas on the surface of the magnetic recording medium among these playback signals. As stated above, certify testing of magnetic recording media is affected not only by undulation of the magnetic recording medium substrate, but also by film thickness distribution of the magnetic film of the magnetic recording medium, and so on.

Figure 4A:
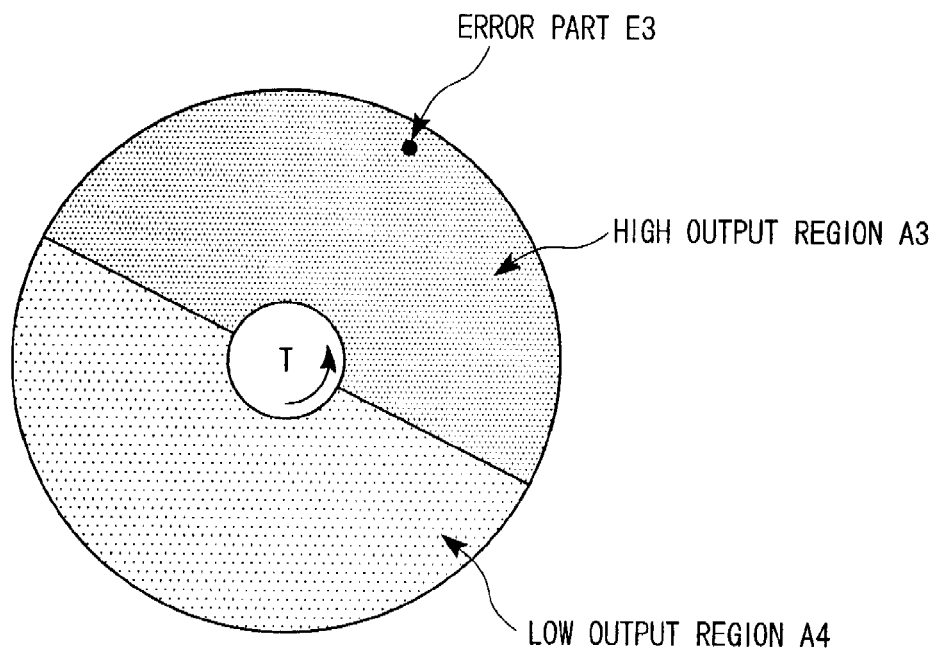
FIG. 4A is a drawing which illustrates the magnetic recording medium in this embodiment.
Figure 4B:
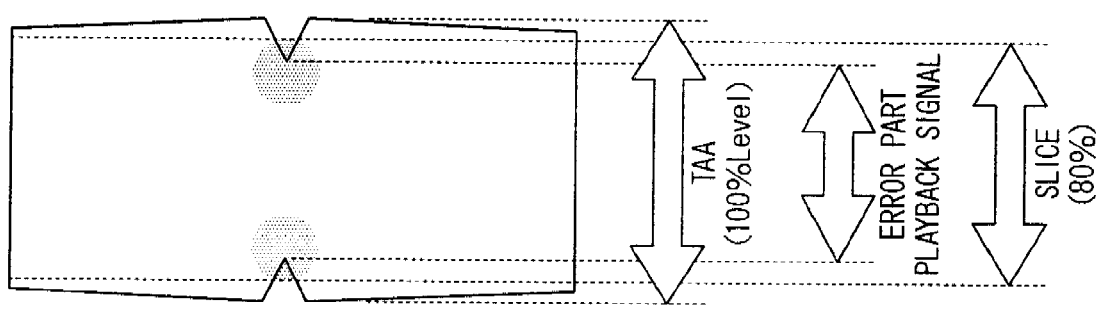
FIG. 4B is a drawing which illustrates playback signals of the magnetic recording medium in this embodiment.

In order to suppress such influences, the certify testing apparatus of the present embodiment sends the signals outputted from the magnetic head during certify testing of a magnetic recording medium to the AGC unit 34 which is an AGC circuit, and stabilizes the signal level. For example, in the case of an error location of the magnetic recording medium which has the high output region A3 and low output region A4 of FIG. 4A, the playback signals of FIG. 4B are obtained by processing the output signals from the magnetic head at that time in the AGC circuit, and detection of error area A3 of FIG. 4A is made possible by the setting of a slice level.

With certify testing of a magnetic recording medium in the foregoing manner, by processing the signals outputted from the magnetic head in an AGC circuit, it becomes possible to appropriately conduct certify testing on a magnetic recording medium wherein undulation occurs in the substrate.

However, when playback signals are processed by AGC circuit, there are cases where appropriate testing of the magnetic recording medium is rendered impossible, because compensation is even conducted up to signals from error bits on the magnetic recording medium surface, and detection of particularly long error bits is not possible. FIG. 5A shows playback signals from a location where the error length is equivalent to 15μ seconds before processing in an AGC circuit. When these playback signals are processed in an AGC circuit where the time constants are respectively 10μ seconds and 100μ seconds, they respectively become the signals of FIG. 5B and FIG. 5C. Considering these, while the reduction in amplitude of FIG. 5A which is the input signal is maintained as is in the signal of FIG. 5C, the reduced portion of amplitude of FIG. 5A which is the input signal is not maintained in the signal of FIG. 5B, and the reduced portion of amplitude of FIG. 5B is smaller than the reduced portion of amplitude of FIG. 5A. This is because the amplitude of the signal is smoothed by the AGC circuit before reaching the minimum amplitude position of the signal of FIG. 5A due to the processing of the signal of FIG. 5A by the AGC circuit, and the amplitude reduction of the signal of FIG. 5B is smaller than the amplitude reduction of the signal of FIG. 5A The method for testing playback signals from magnetic recording media of the invention of the present application prevents compensation of signals originating in long error bits by AGC circuit by dynamically varying the gain of playback signals by amp according to the time from detection of signals originating in error areas on the magnetic recording medium surface among the playback signals from the magnetic head. As compensation of signals from long error bits by AGC circuit is eliminated by this means, it is possible to appropriately test error locations on the magnetic recording medium surface. In magnetic recording playback devices (a so-called hard disk drive devices) using magnetic recording media, AGC circuits may be used in the signal processing system, but the AGC circuit used in the invention of the present application and the AGC circuit used in the signal processing system of a hard disk drive device are completely different in their functions. That is, the AGC circuit used in the invention of the present application is an AGC circuit designed to enable detection of particularly long error bits on the surface of a magnetic recording medium in the aforementioned manner. In contrast, the AGC circuit used in the signal processing system of a hard disk drive device is an AGC circuit designed to process signals written into a magnetic recording medium on the premise that there are no error bits on the surface of the magnetic recording medium.

It is preferable that the method for testing playback signals of magnetic recording media of the invention of the present application adopt a configuration where the time period after detection of a signal originating in an error area on the magnetic recording medium surface is a time period within a range from 25μ seconds to 1000μ seconds, and where, after elapse of this time period, the gain of the signal originating in an error area on the magnetic recording medium surface is dynamically varied by the amp.

In the circuitry of the certify testing apparatus, the AGC circuit operates based on a time constant without relation to the cycle speed of the magnetic head. Generally, output signals of the AGC circuit are varied by an exponential function, and their primary linear system is expressed by the following differential equations.

(Formula 1)

$$\frac{dV}{dt} = -\alpha V \qquad (1)$$

Here, α expresses an exponential reduction factor, and V is expressed as a function of time t. In this instance, the time constant is included in the exponential reduction factor.

(Formula 2)

$$V = V(t) \qquad (2)$$

When the time until operation of the AGC circuit is made shorter than 25μ seconds, error detection capability is lowered, and if it is made longer than 1000μ seconds, error detection capability is saturated, and the effectiveness of the AGC circuit does not improve. Moreover, when the time constant is made still longer than that, it is the equivalent of circuitry that does not provide an AGC circuit, and it is no longer possible to exclude from certify testing the effects of undulation in the substrate and irregularities in film thickness distribution of the magnetic film of a magnetic recording medium.

In the magnetic head 53 used in the invention of the present application, one may use a head suited to high recording density, which not only has an MR (magnetoresistance) element utilizing the giant magnetoresistance effect (GMR) as the playback element, but also a TMR element or the like utilizing the tunnel magnetoresistance effect (TuMR).

By using a TuMR element, it is possible to achieve still higher density recording.

EXAMPLES

Below, the effects of the testing method and testing apparatus for magnetic recording media of the present invention are clarified by presenting specific examples.

Examples

An amorphous glass substrate manufactured by HOYA Co. was used as the non-magnetic substrate. With respect to the size of the glass substrate, outer diameter was 65 mm, inner diameter was 25 mm, and sheet thickness was 1.27 mm.

This substrate was subjected to texturing, and adequately washed and dried, after which it was set inside a DC magnetron sputtering device (C3010 manufactured by Anelva Co. (Japan)). After evacuation to bring the vacuum level to $2 \times 10^{-7}$ Torr ($2.7 \times 10^{-5}$ Pa), lamination was conducted to 6 nm using a target composed of Cr—Mn alloy (Cr: 70 at %, Mn: 30 at %) as the non-magnetic base layer.

Using a target composed of Co—Cr—Pt—B alloy (Co: 60 at %, Cr: 20 at %, Pt: 13 at %, and B: 7 at %) for the magnetic layer, a Co—Cr—Pt—B alloy layer constituting the magnetic layer was formed to a film thickness of 17 nm, and a 3 nm protective layer (carbon) was laminated thereon. Ar pressure at the time of film formation was 3 mTorr (0.4 Pa). Thereafter, a 2 nm lubricant composed of perfluoropolyether was applied by the dip method to form the liquid lubricating layer.

Glide testing was conducted on magnetic recording media manufactured by the foregoing method. In glide testing, mechanical spacing between the test head and the surface of the magnetic recording medium was set to 0.25 micro-inches, and the magnetic recording medium was deemed defective when a signal was outputted which originated in a collision with a protrusion on the magnetic recording medium surface.

Certify testing was conducted on magnetic recording media which passed the glide testing process. Certify testing was conducted by a testing apparatus with the configuration of FIG. 2 having the signal processing system shown in FIG. 3. The rotational frequency of the magnetic recording medium was set to 5400 rpm, the writing frequency of the magnetic recording medium to 80 MHz, the test position of the magnetic recording medium to a position with a radius of 24.2 mm, the test pitch to 2 μm, and the time of the signal corresponding to a detected defect to 15μ seconds. Under these conditions, using the same magnetic recording medium, the time constant of the AGC circuit was made to vary at 2.5μ seconds to 100μ seconds (graph L1), 25μ seconds to 1000μ seconds (graph L2), and 1000μ seconds to 3000μ seconds (graph L3), and certify testing was conducted. The results are shown in FIG. 6.

As is clear from the results of FIG. 6, it was found that detection capability pertaining to defects equivalent to 15μ seconds is markedly improved by providing an AGC unit 34 in the signal processing circuitry of the magnetic head of the certify testing apparatus. Moreover, it was clear that certify testing can be suitably conducted by setting the time constant of the AGC unit 34 within a range of 25μ seconds to 1000μ seconds. As the same magnetic recording medium was used in certify testing under three conditions, the graphs shown in FIG. 6 would ideally constitute a continuous line. The reason why the results of this working example do not constitute a continuous line lies with measurement errors pertaining to the certify testing apparatus.

Comparative Examples

Certify testing was conducted by the conventional method on the magnetic recording medium used in the working example. That is, signals from the magnetic head were processed by a signal processing system which was not provided with the AGC unit 34 of FIG. 3. As a result, the number of defect detections was approximately 820, a value approximately 1.2 times the case of a 1000μ second time constant in the working example. When this result and the actual error map of the magnetic recording medium were compared and contrasted, approximately 20% of the detected defects derived from substrate undulation or film thickness distribution of the magnetic film, and did not derive from error bits of the magnetic recording medium.

This LSI unit 39 may be realized by dedicated hardware. In addition, this LSI unit 39 may be configured by memory and CPU (central processing unit), and its functions may be realized by loading into memory a program designed to realize the functions of the LSI unit 39.

An embodiment of this invention was explained in detail above with reference to drawings, but the specific configuration is not limited to this embodiment, and includes designs and the like within a scope that does not deviate from the intent of this invention.

The present invention is suited for use in certify testing apparatuses which test playback signals of magnetic recording media used in hard disk drives, but is not limited thereto.

According to this invention, as the amplification means amplifies the played back signals at a gain rate controlled so that the level of output signals is fixed only when the time period of a time constant has elapsed after input of a signal originating in an error area, it is possible to detect error locations without influence from undulation of the substrate of the magnetic recording medium, irregularities in film thickness distribution of the magnetic film, and so on.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A certify testing apparatus which tests playback signals of a magnetic recording medium, comprising:
   a magnetic head part which plays back signals that are recorded in said magnetic recording medium;
   an amplification means which amplifies said played back signals at a gain rate controlled according to elapsed time after input of a signal originating in an error area of said magnetic recording medium among said played back signals;
   and a comparison/discrimination means which compares the slice level and level of said amplified signals, and which discriminates the existence or non-existence of errors.

2. The certify testing apparatus according to claim 1, wherein—after input of said signal originating in an error area—said amplifying means conducts amplification at a gain rate controlled so that the output level is fixed only when a time period between 25μ and 1000μ seconds has elapsed.

3. The certify testing apparatus according to claim 2, wherein said amplification means is an automatic gain rate control circuit which amplifies said played back signals at a gain rate controlled at said time constant so that the output level is fixed.

4. The certify testing apparatus according to claim 2, comprising a slice level setting means which calculates an average value of said amplified signals, and which provides said comparison/discrimination means with a value as said slice level obtained by multiplying the pertinent average value by a predetermined rate.

5. The certify testing apparatus according to claim 1, wherein said amplification means is an automatic gain rate control circuit which amplifies said played back signals at a gain rate controlled at said time constant so that the output level is fixed.

6. The certify testing apparatus according to claim 1, comprising a slice level setting means which calculates an average value of said amplified signals, and which provides said comparison/discrimination means with a value as said slice level obtained by multiplying the pertinent average value by a predetermined rate.

7. A certify testing method of a certify testing apparatus which tests playback signals of a magnetic recording medium, which is a certify testing method comprising the steps of:
   a first process which plays back signals that are recorded in said magnetic recording medium;
   a second process which amplifies said played back signals at a gain rate controlled according to elapsed time after input of a signal originating in an error area of said magnetic recording medium among said played back signals;
   and a third process which compares the slice level and level of said amplified signals, and which discriminates the existence or non-existence of errors.

* * * * *